US011621160B2

United States Patent
Venkatasubramanian et al.

(10) Patent No.: US 11,621,160 B2
(45) Date of Patent: Apr. 4, 2023

(54) DOPED AND UNDOPED VANADIUM OXIDES FOR LOW-K SPACER APPLICATIONS

(71) Applicant: Applied Materials, Inc., Santa Clara, CA (US)

(72) Inventors: Eswaranand Venkatasubramanian, Santa Clara, CA (US); Srinivas Gandikota, Santa Clara, CA (US); Kelvin Chan, San Ramon, CA (US); Atashi Basu, Menlo Park, CA (US); Abhijit Basu Mallick, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 9 days.

(21) Appl. No.: 17/391,412

(22) Filed: Aug. 2, 2021

(65) Prior Publication Data

US 2021/0358744 A1 Nov. 18, 2021

Related U.S. Application Data

(62) Division of application No. 16/590,734, filed on Oct. 2, 2019, now Pat. No. 11,094,533, which is a division
(Continued)

(51) Int. Cl.
*H01L 21/02* (2006.01)
*H01L 29/51* (2006.01)
(Continued)

(52) U.S. Cl.
CPC ...... *H01L 21/02175* (2013.01); *C23C 16/405* (2013.01); *C23C 16/45551* (2013.01);
(Continued)

(58) Field of Classification Search
CPC ........... C23C 16/45551; C23C 16/455–45553; H01L 21/02274; H01L 21/0228; H01L 29/78; H01L 29/51; H01L 29/6656
See application file for complete search history.

(56) References Cited

U.S. PATENT DOCUMENTS 5,527,725 A 6/1996 Park
5,923,056 A 7/1999 Lee et al.
(Continued)

FOREIGN PATENT DOCUMENTS

JP 2014198645 A 10/2014

OTHER PUBLICATIONS

Www.azom.com.*
"CVD and ALD Precursors Packaged for Deposition Systems", Sigma-Aldrich.com, http://www.sigmaaldrich.com/materials-science/material-science-products.html?TablePage=21092525 retrieved Apr. 1, 2016, 4 pages.
(Continued)

*Primary Examiner* — Sonya McCall-Shepard
(74) *Attorney, Agent, or Firm* — Servilla Whitney LLC

(57) ABSTRACT

A microelectronic device on a semiconductor substrate comprises: a gate electrode; and a spacer adjacent to the gate electrode, the spacer comprising: a the low-k dielectric film comprising one or more species of vanadium oxide, which is optionally doped, and an optional silicon nitride or oxide film. Methods comprise depositing a low-k dielectric film optionally sandwiched by a silicon nitride or oxide film to form a spacer adjacent to a gate electrode of a microelectronic device on a semiconductor substrate, wherein the low-k dielectric film comprises a vanadium-containing film.

12 Claims, 5 Drawing Sheets

Related U.S. Application Data of application No. 15/491,331, filed on Apr. 19, 2017, now Pat. No. 10,475,642.

(60) Provisional application No. 62/325,538, filed on Apr. 21, 2016.

(51) Int. Cl.
    *H01L 29/66*     (2006.01)
    *H01L 29/78*     (2006.01)
    *C23C 16/40*     (2006.01)
    *C23C 16/455*     (2006.01)

(52) U.S. Cl.
    CPC ...... *H01L 21/0217* (2013.01); *H01L 21/0228* (2013.01); *H01L 21/02164* (2013.01); *H01L 21/02205* (2013.01); *H01L 21/02274* (2013.01); *H01L 29/51* (2013.01); *H01L 29/6656* (2013.01); *H01L 29/78* (2013.01); *H01L 29/6659* (2013.01)

(56) References Cited

U.S. PATENT DOCUMENTS

| | | | |
|---|---|---|---|
| 6,156,395 | A | 12/2000 | Zhang et al. |
| 7,608,509 | B2 | 10/2009 | Kim et al. |
| 2001/0050439 | A1 | 12/2001 | Graas et al. |
| 2006/0079075 | A1* | 4/2006 | Lee .................... H01L 29/4958 |
| | | | 438/587 |
| 2006/0108585 | A1 | 5/2006 | Gan et al. |
| 2007/0004049 | A1 | 1/2007 | Nasu et al. |
| 2007/0275532 | A1 | 11/2007 | Chidambarrao et al. |
| 2009/0011145 | A1 | 1/2009 | Yun et al. |
| 2010/0170868 | A1 | 7/2010 | Lin et al. |
| 2012/0181617 | A1 | 7/2012 | Luo et al. |
| 2014/0110765 | A1 | 4/2014 | Murali et al. |
| 2016/0336178 | A1 | 11/2016 | Swaminathan et al. |

OTHER PUBLICATIONS

PCT International Search Report and Written Opinion in PCT/US2017/028315 dated Jul. 27, 2017, 13 pages.

\* cited by examiner

DOPED AND UNDOPED VANADIUM OXIDES FOR LOW-K SPACER APPLICATIONS

CROSS-REFERENCE TO RELATED APPLICATIONS

This application is a divisional of U.S. application Ser. No. 16/590,734, filed Oct. 2, 2019, which is a divisional of U.S. application Ser. No. 15/491,331, filed Apr. 19, 2017, issued as U.S. Pat. No. 10,475,642 on Nov. 12, 2019, which claims priority to U.S. Provisional Application No. 62/325,538, filed Apr. 21, 2016, all of which are incorporated by reference herein in their entirety.

TECHNICAL FIELD

The present disclosure relates generally to methods of depositing thin films. In particular, the disclosure relates to processes for the deposition of doped and undoped low-k vanadium oxide films as spacers.

BACKGROUND

Microelectronic devices are fabricated on a semiconductor substrate as integrated circuits in which various conductive layers are interconnected with one another to permit electronic signals to propagate within the device. An example of such a device is a complementary metal-oxide-semiconductor (CMOS) field effect transistor (FET) or MOSFET, including both planar and three-dimensional structures. An example of a three-dimensional structure is a FinFET device.

Over the past decades, the MOSFET has continually been scaled down in size and modern integrated circuits are incorporating MOSFETs with channel lengths of less than 0.1 micron. Devices with a 65 nm feature size (with the channel being even shorter) are currently in production. The decrease in feature size has resulted in certain challenges because small MOSFETs exhibit higher leakage currents, and lower output resistance than larger devices. Still, smaller MOSFETs are desirable for several reasons. The main reason to make transistors smaller is to pack more and more devices in a given chip area, reducing the price per chip. Additionally, the reduction in transistor dimension can help increase the speed.

An exemplary FET or MOSFET includes a gate electrode on a gate dielectric layer on a surface of a semiconductor substrate. Source/drain regions are provided along opposite sides of the gate electrode. The source and drain regions are heavily doped regions of the semiconductor substrate. Usually a silicide layer, for example, nickel silicide is used to couple contacts in an interlayer dielectric to the source and drain regions. Sidewall spacers are disposed on laterally opposite sidewalls of the gate electrode.

Because of small MOSFET geometries, voltage that can be applied to a gate electrode is be reduced to maintain reliability. To maintain performance, the threshold voltage of the MOSFET is reduced as well. As threshold voltage is reduced, the transistor cannot be switched from complete turn-off to complete turn-on with the limited voltage swing available. Subthreshold leakage, which was ignored in the past, now can have a significant impact on device performance.

Low-k spacer materials are used in integration of gate electrodes. Low-k spacer materials minimize undesirable properties such as resistance-capacitance (RC) delay, parasitic capacitance, power dissipation, and cross-talk. Traditional low-k spacers are based on silicon starting with the oxide (k=3.9), which achieve reduction of 'k' by incorporating other elements such as fluorine (F) (SiOF, k~3.7) and carbon (C) (SiOC, k~2.8). Other low-k spacers incorporate polymers into the system or induce porosity (air gap, k=1) in the structure resulting in aero and xerogels (k as low as 1.8). Many of these low-k materials are subject to failure due to, for example, poor mechanical strength, poor thermal stability, and integration challenges.

There is a need for low-k spacer materials that provide mechanical strength and good thermal stability.

SUMMARY

One or more embodiments of the disclosure are directed to a microelectronic device on a semiconductor substrate, the microelectronic device comprising: a gate electrode; and a low-k dielectric film adjacent to the gate electrode, the low-k dielectric film comprising one or more species of vanadium oxide, which is optionally doped.

Additional embodiments of the disclosure are directed to processing methods comprising: depositing a spacer adjacent to a gate electrode of a microelectronic device on a semiconductor substrate, the spacer comprising: a low-k dielectric film comprising one or more species of vanadium oxide, which is optionally doped, and an optional silicon nitride or oxide film.

Further embodiments of the disclosure are directed to processing methods comprising: placing a semiconductor substrate having a substrate surface into a processing chamber comprising a plurality of sections, each section separated from adjacent sections by a gas curtain. Optionally, at least a portion of the substrate surface to a first process condition in a first section of the processing chamber, the first process condition comprising a silicon-containing precursor. The substrate surface is laterally moved through a gas curtain to a second section of the processing chamber. Optionally, at least a portion of the substrate surface is exposed to a second process condition in a second section of the processing chamber, the second process condition comprising a nitrogen-containing or oxygen-containing precursor to form a film with the silicon-containing precursor optionally with a plasma. Optionally, exposure to the first section and the second section, including lateral movement of the substrate surface to form a silicon nitride or oxide film is repeated. The substrate surface is laterally moved through a gas curtain to a third section of the processing chamber. At least a portion of the substrate surface is exposed to a third process condition in a third section of the processing chamber, the third process condition comprising a vanadium-containing precursor. The substrate surface is laterally moved through a gas curtain to a fourth section of the processing chamber. The substrate surface is exposed to a fourth process condition in the fourth section of the processing chamber. The fourth process condition comprises a first reactant to form a film with the vanadium-containing precursor, the film comprising a species according $VO_x$, wherein x is in the range of 1-3. Optionally, the substrate surface is laterally moved through a gas curtain to a fifth section of the processing chamber. The substrate surface is optionally exposed to a fifth process condition in the fifth section of the processing chamber. The fifth process condition comprises a second reactant. Exposure to the third section, the fourth section, and the optional fifth section, including lateral movement of the substrate surface, is optionally repeated to form a low-k dielectric film optionally on the silicon nitride or oxide film. Exposure to the first section and the second section, including lateral movement of the substrate surface, is optionally repeated to form a second silicon nitride or oxide film on the low-k-dielectric film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
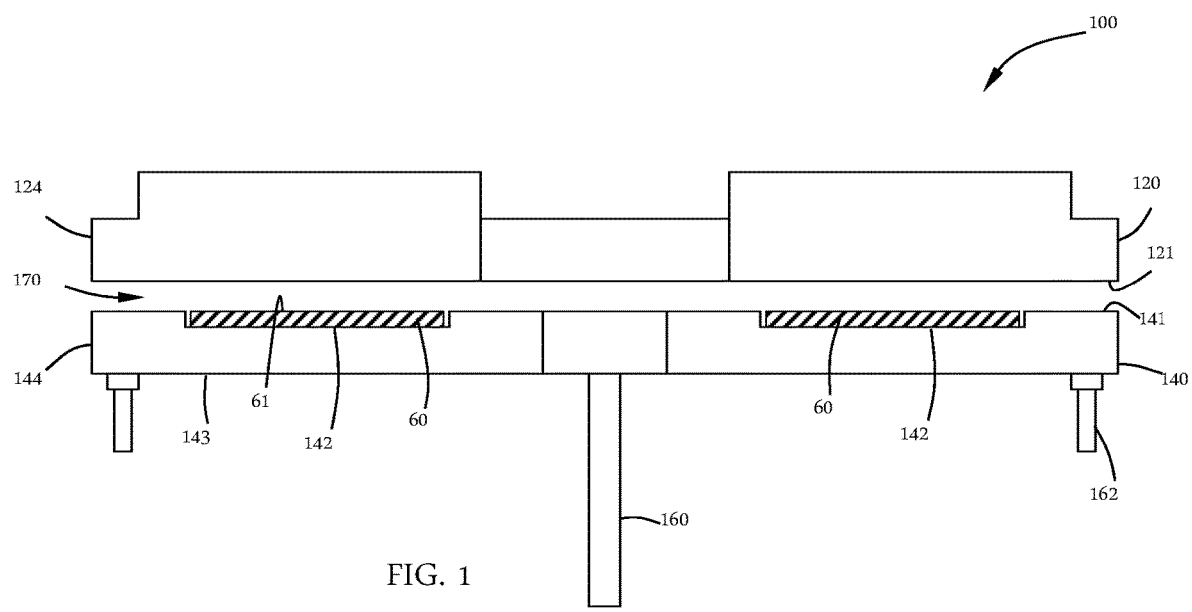
FIG. 1 shows a cross-sectional view of a batch processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Low-k dielectric thin films may be used in blanket and patterned structures for various device applications. As used in this regard, "low-k dielectric film" refers to insulating materials that have a lower dielectric constant (k) than silicon nitride (SiN), which has a k value of 8.

In one or more embodiments, low-k dielectric thin films based on vanadium and oxygen of varying stoichiometries are deposited onto semiconductor substrate surfaces as spacers. The deposited material may have a dielectric constant (k) value in the range of 1 to less than 8, depending upon the composition and stoichiometry. The deposited film offers excellent conformality when deposited by ALD. The film advantageously also has good thermal stability, and will also be very compatible with various integration schemes. The material also has good chemical resistance (RIE) and will withstand patterning chemistry that would otherwise destroy other low-k materials. The film also has good mechanical stability. The low-k dielectric film is optionally sandwiched by a silicon nitride or oxide film, which is advantageous in the presence of potentially leaky films.

Suitable low-k dielectric films include species that include but are not limited to: VO to $VO_3$ and all intervening compositions, which are optionally doped with dopants, which include but are not limited to C, N, Si, B, and F. The vanadium species are generally referred to as $VO_x$, wherein x is in the range of 1-3. The films may be doped with 0-50 atomic % of the one or more dopants, with reference to the total film weight.

According to one or more embodiments, the method uses a chemical vapor deposition (CVD) process. In such embodiments, the substrate surface is exposed to a first reactive gas and a second reactive gas at the same time so that the first reactive gas and the second reactive gas mix during formation of the film.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reactant, although there may be some overlap. As used in this specification and the appended claims, the terms "precursor", "reactant", "reactive gas" and the like are used interchangeably to refer to any gaseous species that can react with the substrate surface, or a species present on the substrate surface.

In one or more embodiments, the film deposition is performed using an Atomic Layer Deposition (ALD) process. An ALD process is a self-limiting process where a single layer of material is deposited using a binary (or higher order) reaction. An individual ALD reaction is theoretically self-limiting continuing until all available active sites on the substrate surface have been reacted. ALD processes can be performed by time-domain or spatial ALD.

In a time-domain process, the processing chamber and substrate are exposed to a single reactive gas at any given time. In an exemplary time-domain process, the processing chamber might be filled with a metal precursor for a time to allow the metal precursor to fully react with the available sites on the substrate. The processing chamber can then be purged of the precursor before flowing a second reactive gas into the processing chamber and allowing the second reactive gas to fully react with the substrate surface or material on the substrate surface. The time-domain process minimizes the mixing of reactive gases by ensuring that only one reactive gas is present in the processing chamber at any given time. At the beginning of any reactive gas exposure, there is a delay in which the concentration of the reactive species goes from zero to the final predetermined pressure. Similarly, there is a delay in purging all of the reactive species from the process chamber.

In a spatial ALD process, the substrate is moved between different process regions within a single processing chamber. Each of the individual process regions is separated from adjacent process regions by a gas curtain. The gas curtain helps prevent mixing of the reactive gases to minimize any gas phase reactions. Movement of the substrate through the different process regions allows the substrate to be sequentially exposed to the different reactive gases while preventing gas phase reactions.

Some embodiments of the disclosure are directed to film deposition processes using a batch processing chamber, also referred to as a spatial processing chamber. FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. In a binary reaction, the plurality of gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s).

Figure 2:
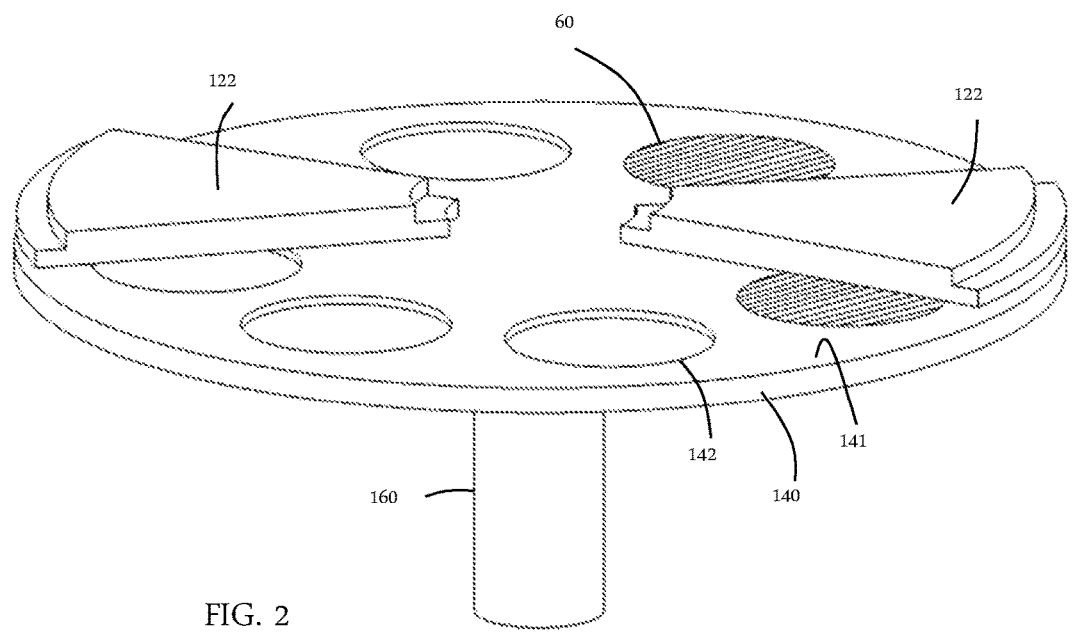
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
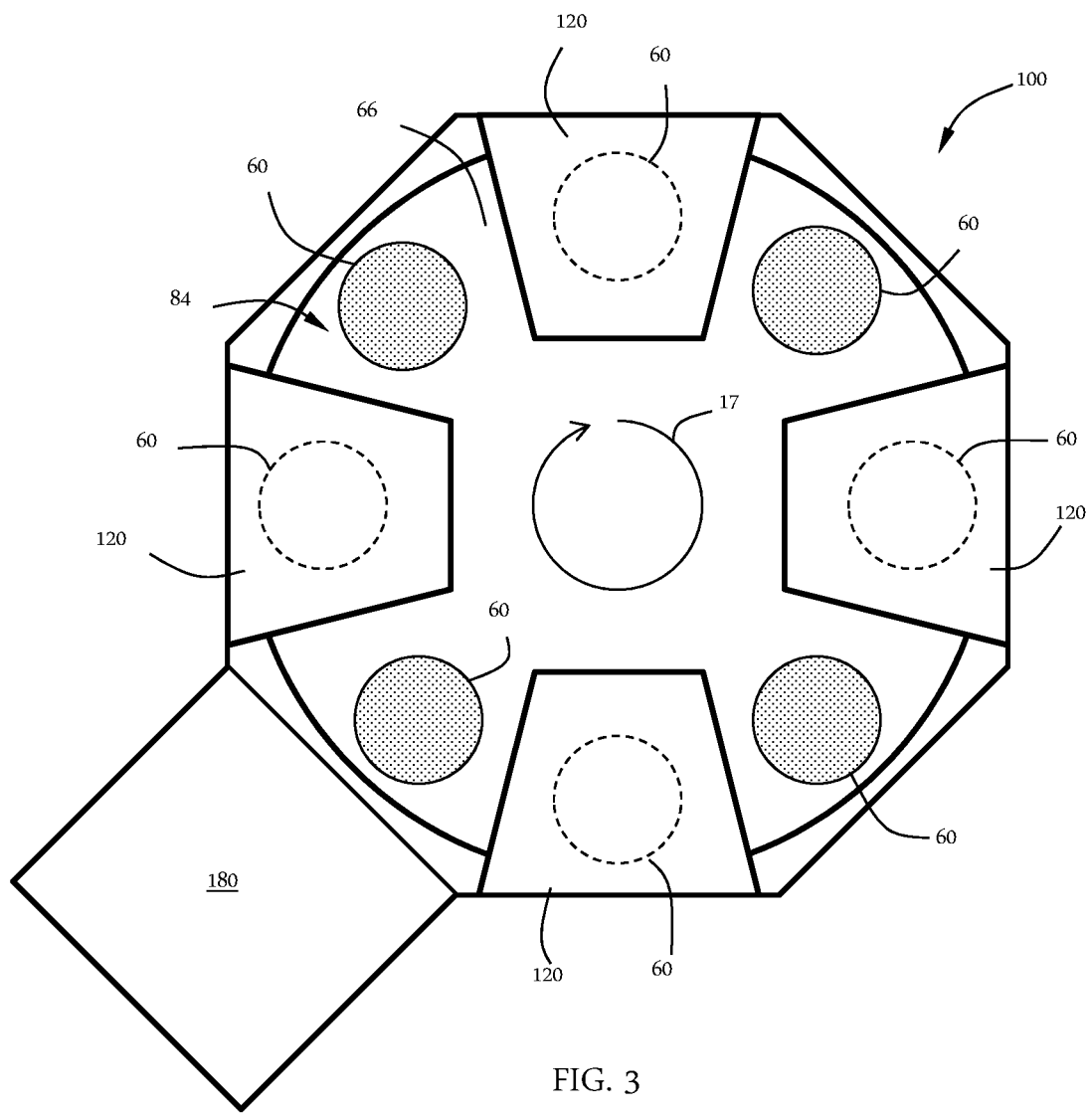
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the injector assemblies 30. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one. In an exemplary embodiment, the gas distribution assembly 120 includes eight processing regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing between each layer deposition (e.g., exposure to plasma).

Figure 4:
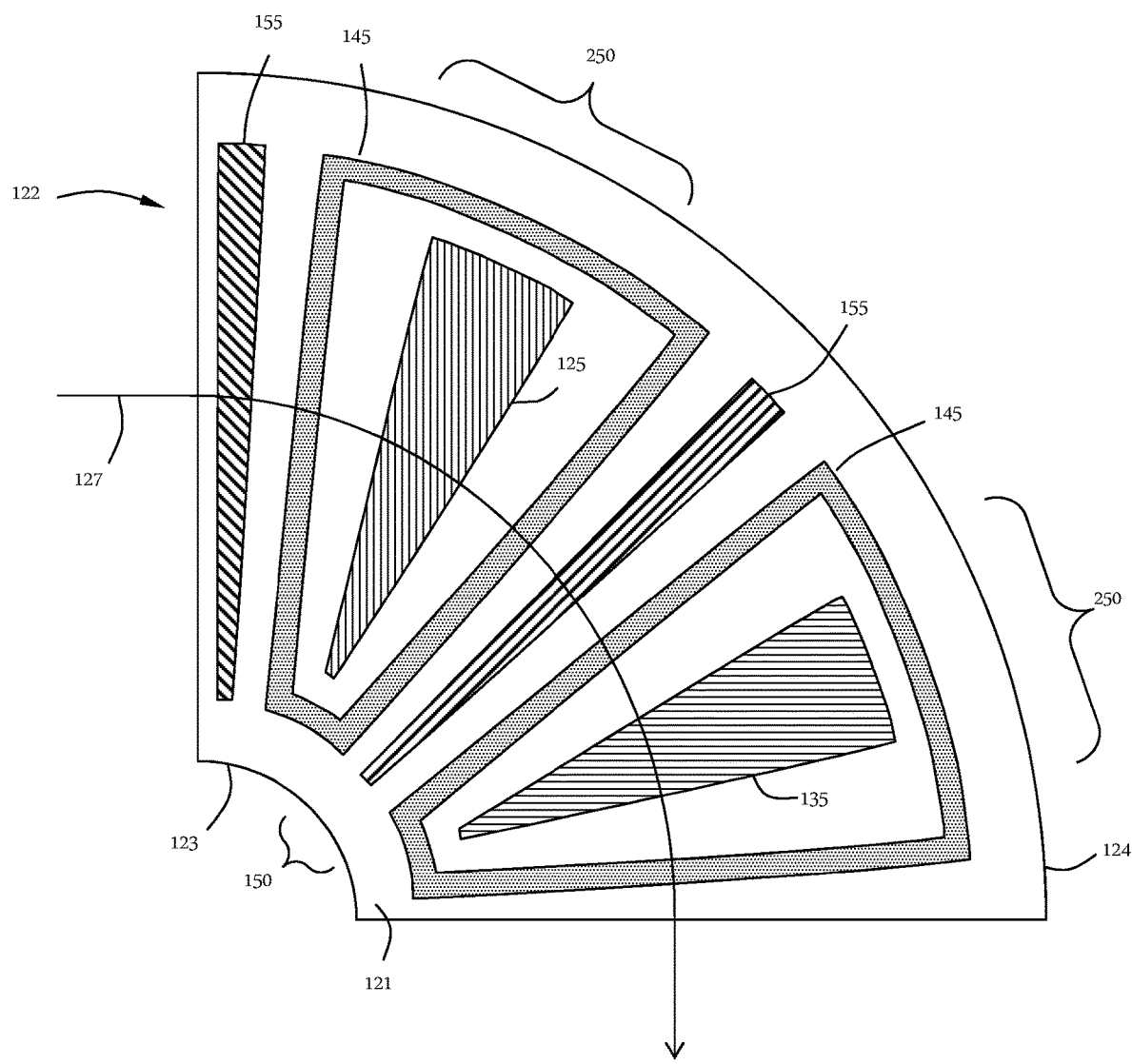
FIG. 4 shows a schematic view of a portion of a wedge shaped gas distribution assembly for use in a batch processing chamber in accordance with one or more embodiment of the disclosure.
Figure 5:
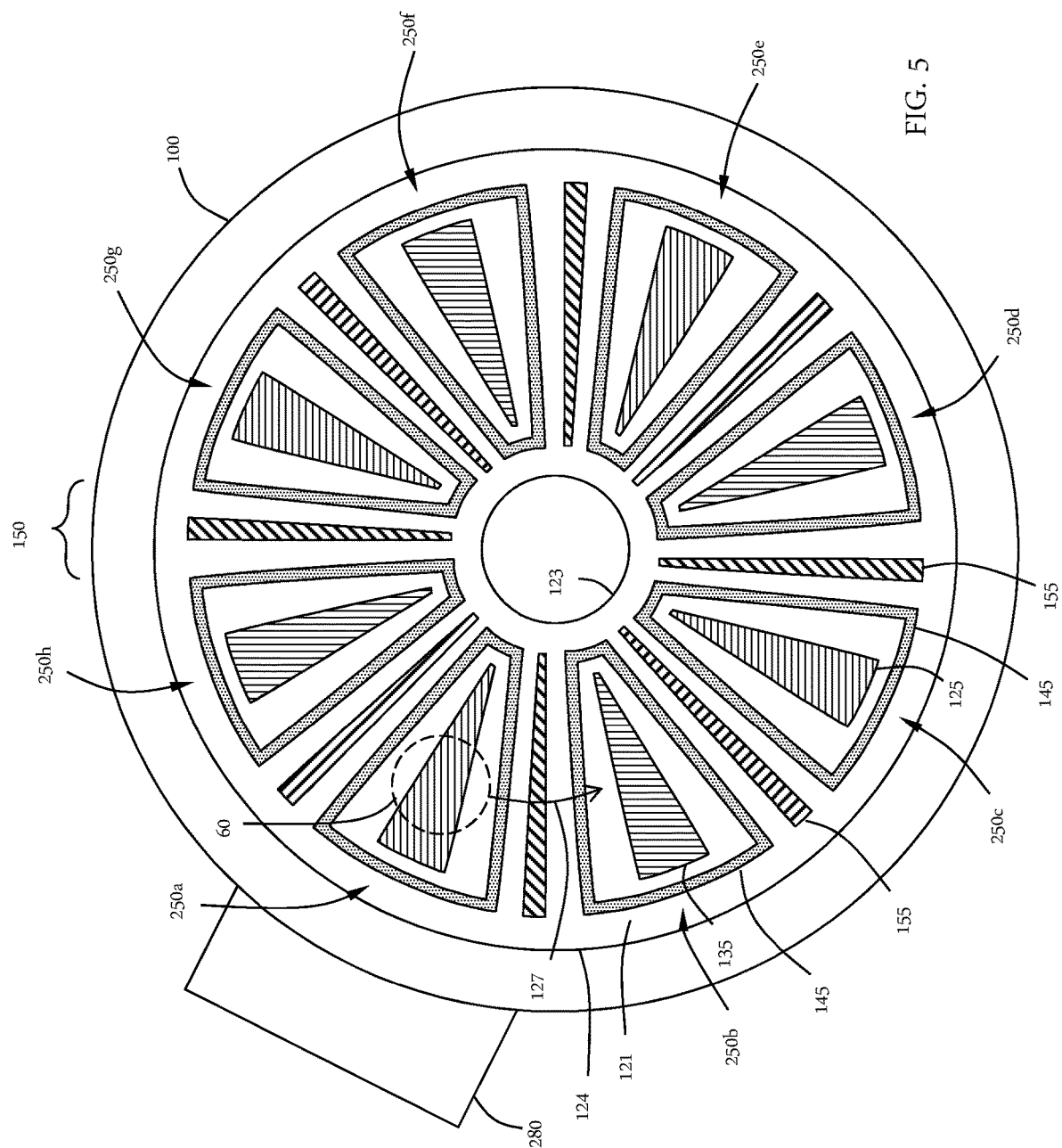
FIG. 5 shows a schematic view of a batch processing chamber in accordance with one or more embodiments of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 155 and elongate vacuum ports 145 in a front surface 121 of the gas distribution assembly 220. The plurality of elongate gas ports 125, 135, 155 and elongate vacuum ports 145 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first gas port 125 and the second gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120. The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150*a*, 150*b*. Rotating the substrate 60 along path 127 will move the substrate counter-clockwise around the processing chamber 100. Thus, the substrate 60 will be exposed to the first processing region 250*a* through the eighth processing region 250*h*, including all processing regions between.

Embodiments of the disclosure are directed to processing methods comprising a processing chamber 100 with a plurality of processing regions 250*a*-250*h* with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250*a*-250*h*. The number of gas curtains is generally equal to or greater than the number of processing regions.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example if the first reactive gas is flowing into processing regions 250*b* through processing region 250*h*, an inert gas would be flowing into processing region 250*a*. The inert gas can be flowed through the first reactive gas port 125 or the second gas port 135.

The inert gas flow within the processing regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the processing regions easier by decreasing the differences in pressure between adjacent regions.

Figure 6:
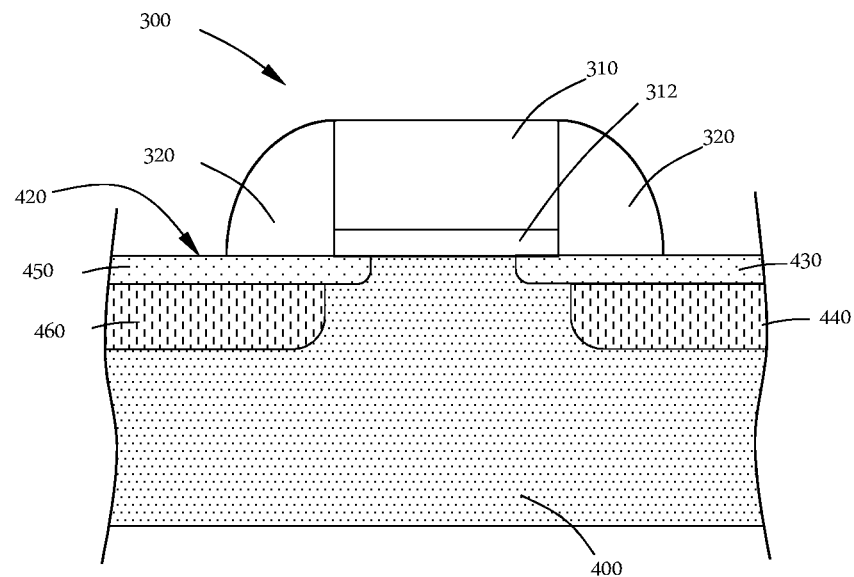
FIG. 6 shows a partial cross-sectional view of a microelectronic device on a semiconductor substrate in accordance with one or more embodiments of the disclosure.

FIG. 6 shows a partial cross-sectional view of a microelectronic device on a semiconductor substrate in accordance with one or more embodiments of the disclosure. A microelectronic device 300 comprises a gate electrode 310 on a gate dielectric layer 312 on a surface 320 of a semiconductor substrate 400. First and second source regions 450, 460 and first and second drain regions 430, 440 are provided along opposite sides of the gate electrode. The source regions 450, 460 and drain regions 430, 440 are heavily doped regions of the semiconductor substrate 400. Sidewall spacers 320 are disposed on laterally opposite sidewalls of the gate electrode 310.

The Figures show a substrate having a single microelectronic device for illustrative purposes; however, those skilled in the art will understand that there can be more than one microelectronic device.

In one or more embodiments, the spacers 320 comprise a low-k dielectric film comprising one or more species of vanadium oxide, which is optionally doped. The species of vanadium oxide are according to $VO_x$, wherein x is in the range of 1-3 and wherein the film comprises one or more dopants in an amount in the range of 0 to 50 atomic % of the film. The dopants include but are not limited to carbon (C), nitrogen (N), silicon (Si), boron (B), and fluorine (F). One or more embodiments of the disclosure have a thickness of the low-k dielectric film in the range of about 10 Å to about 200 Å. Thickness is measured by electron microscopy.

Figure 7:
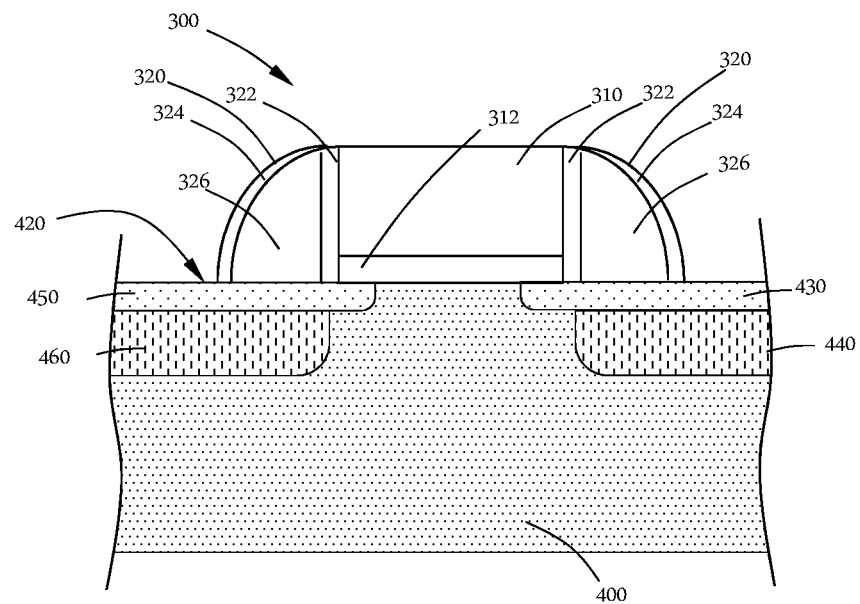
FIG. 7 shows a partial cross-sectional view of a microelectronic device on a semiconductor substrate in accordance with one or more embodiments of the disclosure.

FIG. 7 shows a partial cross-sectional view of a microelectronic device on a semiconductor substrate in accordance with one or more embodiments of the disclosure. A microelectronic device 300 comprises a gate electrode 310 on a gate dielectric layer 312 on a surface 320 of a semiconductor substrate 400. First and second source regions 450, 460 and first and second drain regions 430, 440 are provided along opposite sides of the gate electrode. The source regions 450, 460 and drain regions 430, 440 are heavily doped regions of the semiconductor substrate 400. Sidewall spacers 320 are disposed on laterally opposite sidewalls of the gate electrode 310. The spacers comprise a low-k dielectric film comprising one or more species of vanadium oxide 326 and adjacent first and second silicon nitride or oxide layers 322 and 324. In one or more embodiments, the silicon nitride or oxide film has a thickness in the range of 10-50 Å. Thickness is measured by electron microscopy.

The low-k film formed can be any suitable film. In some embodiments, the film formed is a vanadium-containing film, which is optionally doped. The film can be formed by any suitable process including, but not limited to, chemical vapor deposition (CVD), plasma-enhanced chemical vapor deposition (PECVD), atomic layer deposition (ALD), and plasma-enhanced atomic layer deposition (PEALD). Precursors of vanadium may be any vanadium-organometallic compound. Suitable vanadium precursors include, but are not limited to, vanadium oxytri-isopropoxide (VOTP), vanadium oxytriethoxide, vanadium acetylacetonate, vanadium oxytrichloride, vanadium(III) chloride, vanadium(IV) chloride, and the like. The precursor may be heated in a hot can to increase the vapor pressure and be delivered to the chamber using a carrier gas (e.g., ultrahigh purity (UHP) Ar, He, $H_2$, etc.). The reactant may comprise an oxygen source, a nitrogen source, a carbon source, a hydrogen source, a boron source, a silicon source or combinations thereof. Other reactants may comprise boron or silicon. The reactant may be selected from one or more of: $O_2$, $O_3$, $H_2O$, $H_2O_2$, $H_2$, $N_2$, $NH_3$, $N_2H_4$, $C_3H_6$, $C_2H_2$, $C_2H_{14}$ $B_2H_6$, $Si_2H_6$, $SiH_4$, $SiF_4$, or $SiHF_x$, and plasmas thereof.

The silicon nitride or oxide film formed can be any suitable film. The film can be formed by any suitable process including, but not limited to, chemical vapor deposition (CVD), plasma-enhanced chemical vapor deposition (PECVD), atomic layer deposition (ALD), and plasma-enhanced atomic layer deposition (PEALD). Precursors of silicon include, but are not limited to: $SiH_4$ or $Si_2H_6$, and plasmas thereof. The silicon precursor may be heated in a hot can to increase the vapor pressure and be delivered to the chamber using a carrier gas (e.g., ultrahigh purity (UHP) Ar, He, $H_2$, etc.). The reactant comprises a nitrogen or oxygen source, which may be selected from one or more of: $O_2$, $O_3$, $H_2O$, $H_2O_2$, $N_2$, $NH_3$, $N_2H_4$, and plasmas thereof.

In some embodiments, the spacer 320 forms conformally on at least one feature. As used herein, the term "conformal", or "conformally", refers to a layer that adheres to and uniformly covers exposed surfaces with a thickness having a variation of less than 5% relative to the average thickness of the film. For example, a 1,000 Å thick film would have less than 50 Å variations in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces.

In some embodiments, the spacer 320 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

Accordingly, one or more embodiments of the disclosure are directed to processing methods utilizing a batch processing chamber like that shown in FIG. 5. For formation of the low-k vanadium oxide layer, a substrate 60 having a gate electrode is placed into the processing chamber which has a plurality of processing regions 250 (also referred to as sections), each processing region separated from adjacent processing regions by a gas curtain 150. At least a portion of the substrate surface is exposed to a first process condition in a first processing region 250a of the processing chamber. The first process condition of some embodiments comprises a vanadium-containing precursor.

The substrate surface is laterally moved through a gas curtain 150 to a second processing region 250b of the processing chamber. The substrate surface is exposed to a second process condition in the second processing region 250b. The second process condition of some embodiments comprises a reactant to form a film with the vanadium-containing precursor, the film comprising a species according $VO_x$, wherein x is in the range of 1-3.

Optionally, the substrate surface is laterally moved through a gas curtain 150 to a third processing region 250c of the processing chamber. The substrate surface can then be exposed to a third process condition in the third processing region 250c. The third process condition of some embodiments comprises a second reactant that optionally includes a dopant.

In some embodiments, the substrate is exposed to additional first, second, and optional third process conditions to form a film with a predetermined film thickness.

According to one or more embodiments, the substrate is subjected to processing prior to and/or after forming the layer. This processing can be performed in the same chamber or in one or more separate processing chambers. For formation of the silicon nitride or oxide layers before and after formation of the vanadium oxide layer, a substrate 60 having a gate electrode is placed into the processing chamber which has a plurality of processing regions 250 (also referred to as sections), each processing region separated from adjacent processing regions by a gas curtain 150. At least a portion of the substrate surface is exposed to a first process condition in a first processing region 250a of the processing chamber. The first process condition of some embodiments comprises a silicon-containing precursor.

The substrate surface is laterally moved through a gas curtain 150 to a second processing region 250b of the processing chamber. The substrate surface is exposed to a second process condition in the second processing region 250b. The second process condition of some embodiments comprises a reactant optionally with plasma to form a film with the silicon-containing precursor, the film comprising a species of SiN or SiO.

The substrate surface is laterally moved through a gas curtain 150 to a third processing region 250c of the processing chamber. The substrate surface can then be exposed to a third process condition in the third processing region 250c. The third process condition of some embodiments comprises an inert gas such as Argon and a plasma such as RF plasma.

In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in a reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge all of the excess reagent out of the chamber before flowing in additional regent. Therefore, any leftover reagent in the chamber may react. With spatial separation, excess reagent does not need to be purged, and cross-contamination is limited. Furthermore, a lot of time can be taken to purge a chamber, and therefore throughput can be increased by eliminating the purge step.

EXAMPLES

Example 1

Atomic Layer Deposition of Vanadium Oxide Thin Film by Spatial ALD:

Vanadium oxide thin film is fabricated by using VOTP+ $H_2O+H_2$ as precursors in a spatial ALD platform according to FIGS. 1-5. Vanadium oxytri-isopropoxide (VOTP) is a vanadium precursor, $H_2O$ is an oxidant, and $H_2$ is a third reactant. With reference to FIG. 5, VOTP with an inert gas carrier ($N_2$ or Ar) flows through the first processing region 250a, $H_2O$ with gas carrier ($N_2$ or Ar) or without flows through second processing region 250b, and $H_2$ with diluent ($N_2$ or Ar) or without flows through third processing region 250c. Fourth processing region 250d may have purge flow or flow of gases such as $B_2H_6$ or $Si_2H_6$, or a film treatment condition such as high temperature or plasma. The conditions in the first through fourth processing regions 250a-250d can be repeated in the fifth through eighth processing regions 250e-250h so that one rotation exposes the wafer to two ALD cycles. A precursor flow for VOTP is 500 sccm with Ar with a bubbler temperature of 100° C. Feed lines are heated to be at a slightly higher temperature than the bubbler to prevent condensation. $H_2O$ with Ar carry flow is set between 100-500 sccm. $H_2$ flow is set between 100-1000 sccm. Deposition is carried out at a temperature of about 180° C. (may range from 25° C. or room temperature to 600° C.) and without any plasma (plasma may also be used). Process pressure is 5 torr (2-100 torr range), pedestal is rotated at 20 RPM (1-100 RPM range), wafer spacing is 300 mils (100-10000 mils range). As the pedestal rotates, the wafer is sequentially exposed to the three different reactive gases resulting in film growth. The underlying representative chemical reaction is provided.

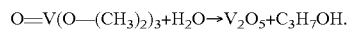

$$O=V(O-(CH_3)_2)_3+H_2O \rightarrow V_2O_5+C_3H_7OH.$$

$H_2$ is utilized to control the oxygen content of the film to achieve predetermined properties. The film thus deposited using VOTP as a vanadium precursor has 'C' as a dopant (concentration can be varied by tuning process conditions) at up to 20 wt %. The resultant film has a dielectric constant in the range of 2 to 8, with the precise value determined by the exact composition of the film.

Example 2

Atomic Layer Deposition of a Silicon Nitride or Oxide "Sandwich" Layer.

A thin (10-50 Å) silicon nitride or oxide layer is deposited twice, once prior to vanadium oxide and once after vanadium oxide thin film deposition in the same chamber. With reference to FIG. 5, one of the following Si precursors: $SiH_4$ or $Si_2H_6$ flows through the first processing region 250a. A nitrogen precursor, for example, $NH_3$ or $N_2$ or an oxygen precursor, for example, $O_2$ or $O_3$ flow through processing region 250b along with plasma (100-1000 W). Ar flows through processing region 250c along with RF plasma (100-1000 W). Fourth processing region 250d has a purge flow. The conditions in the first through fourth processing regions 250a-250d can be repeated in the fifth through eighth processing regions 250e-250h so that one rotation exposes the wafer to two ALD cycles. The temperature of deposition ranges from 100 to 600° C.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
   placing a semiconductor substrate having a substrate surface comprising a gate electrode into a processing chamber comprising a plurality of sections, each section separated from adjacent sections by a gas curtain;
   exposing at least a portion of the substrate surface to a third process condition in a third section of the processing chamber, the third process condition comprising a vanadium-containing precursor;
   laterally moving the substrate surface through a gas curtain to a fourth section of the processing chamber;
   exposing the substrate surface to a fourth process condition in the fourth section of the processing chamber, the fourth process condition comprising a first reactant to form a low-k dielectric film with the vanadium-containing precursor on laterally opposite sidewalls of the gate electrode; and
   repeating exposure to the third section and the fourth section including lateral movement of the substrate surface to further form the low-k dielectric film.

2. The method of claim 1, further comprising:
   exposing at least a portion of the substrate surface to a first process condition in a first section of the processing chamber, the first process condition comprising a silicon-containing precursor;
   laterally moving the substrate surface through a gas curtain to a second section of the processing chamber;
   exposing at least a portion of the substrate surface to a second process condition in a second section of the processing chamber, the second process condition comprising a nitrogen-containing or oxygen-containing precursor to form a silicon nitride or silicon oxide film with the silicon-containing precursor; and
   laterally moving the substrate surface through a gas curtain to the third section of the processing chamber.

3. The method of claim 2, wherein the second process condition comprises a plasma.

4. The method of claim 2, further comprising repeating exposure to the first section and the second section, including lateral movement of the substrate surface, to further form the silicon nitride or silicon oxide film before laterally moving the substrate surface to the third section.

5. The method of claim 1, further comprising:
   laterally moving the substrate surface through a gas curtain from the fourth section to a fifth section of the processing chamber; and
   exposing the substrate surface to a fifth process condition in the fifth section of the processing chamber, the fifth process condition comprising a second reactant.

6. The method of claim 5, wherein repeating exposure to the third section and the fourth section further comprises exposing the substrate surface to the fifth process condition including lateral movement of the substrate surface.

7. The method of claim 2, further comprising repeating exposure to the first section and the second section, including lateral movement of the substrate surface, to form a second silicon nitride or silicon oxide film on the low-k-dielectric film.

8. The method of claim 1, wherein the low-k dielectric film comprises a species according $VO_x$, wherein x is in a range of 1-3.

9. The processing method of claim 2, wherein the silicon nitride or oxide film is adjacent to the low-k dielectric film.

10. The method of claim 1, wherein vanadium-containing precursor comprises vanadium oxytri-isopropoxide and the first reactant comprises one or more of: $O_2$, $O_3$, $H_2O$, $H_2O_2$, $H_2$, $N_2$, $NH_3$, $C_3H_6$, $C_2H_2$, $C_2H_4$, $B_2H_6$, $Si_2H_6$, $SiH_4$, $SiF_4$, or $SiH_xF_{(4-x)}$ wherein x is 1-3.

11. The method of claim 5, wherein vanadium-containing precursor comprises vanadium oxytri-isopropoxide and the first and second reactants independently comprise one or more of: $O_2$, $O_3$, $H_2O$, $H_2O_2$, $H_2$, $N_2$, $NH_3$, $C_3H_6$, $C_2H_2$, $C_2H_4$, $B_2H_6$, $Si_2H_6$, $SiH_4$, $SiF_4$, or $SiH_xF_{(4-x)}$ wherein x is 1-3.

12. The method of claim 1, wherein the low-k dielectric film has a dielectric constant (k) in a range of 1 to less than 8.

* * * * *